United States Patent [19]

Southworth et al.

[11] 4,396,156
[45] Aug. 2, 1983

[54] SPRAY GUN FOR CLEANING AND REMOVING STANDING PARTICLES FROM WAFERS AND SUBSTRATES

[75] Inventors: Peter R. Southworth, Mission Viejo; Gregory R. Baxter, Orange, both of Calif.

[73] Assignee: Nacom Industries, Inc., Tustin, Calif.

[21] Appl. No.: 355,768

[22] Filed: Mar. 8, 1982

[51] Int. Cl.³ .............................................. B05B 9/01
[52] U.S. Cl. .................................. 239/526; 239/562; 239/586; 239/DIG. 19
[58] Field of Search ............... 239/525, 526, 530, 548, 239/579, 583, 562, 586, DIG. 19

[56] References Cited

U.S. PATENT DOCUMENTS

| | | | |
|---|---|---|---|
| 1,669,419 | 5/1928 | Lunken | 239/586 |
| 3,415,454 | 12/1968 | Bucknell et al. | 239/562 |
| 3,498,546 | 3/1970 | Logan et al. | 239/583 |
| 4,148,438 | 4/1979 | Moen | 239/583 |

*Primary Examiner*—John J. Love
*Assistant Examiner*—Jon M. Rastello
*Attorney, Agent, or Firm*—Christie, Parker & Hale

[57] ABSTRACT

A hand-held spray gun comprises a pistol grip handle and a trigger that can be squeezed toward the pistol grip for actuating a poppet valve in the spray gun body to discharge fluid through a nozzle in the end of the spray gun. The poppet valve extends axially through a supply chamber which receives fluid passing to it through the interior of the pistol grip which, in turn, is connected to the source of the fluid, such as a liquid or gas. The supply chamber is sealed from a larger dispensing chamber through a seal carried on the poppet valve. The dispensing chamber communicates with long, narrow discharge passages in the nozzle end of the spray gun. The end of the poppet valve is enlarged to form a valve guide that slides back and forth in a valve guide cavity in the nozzle. A return spring in the cavity is biased against the face of the valve guide. The valve guide is sealed to the cavity to isolate the return spring from the fluid in the dispensing chamber. When the trigger is squeezed, it forces the poppet valve to move in the chamber to force fluid into the dispensing chamber to, in turn, force the fluid out through the discharge passages. This movement of the poppet valve also causes the valve guide to move against the bias of the return spring. When pressure is released from the trigger, the return spring forces the valve guide and poppet valve back to the normal position. There is no contact between the fluid and any parts of the spray gun other than parts made of chemically inert materials. The return spring, being made of metal, is isolated from the fluid to eliminate any contamination from possible chemical reactions.

6 Claims, 2 Drawing Figures

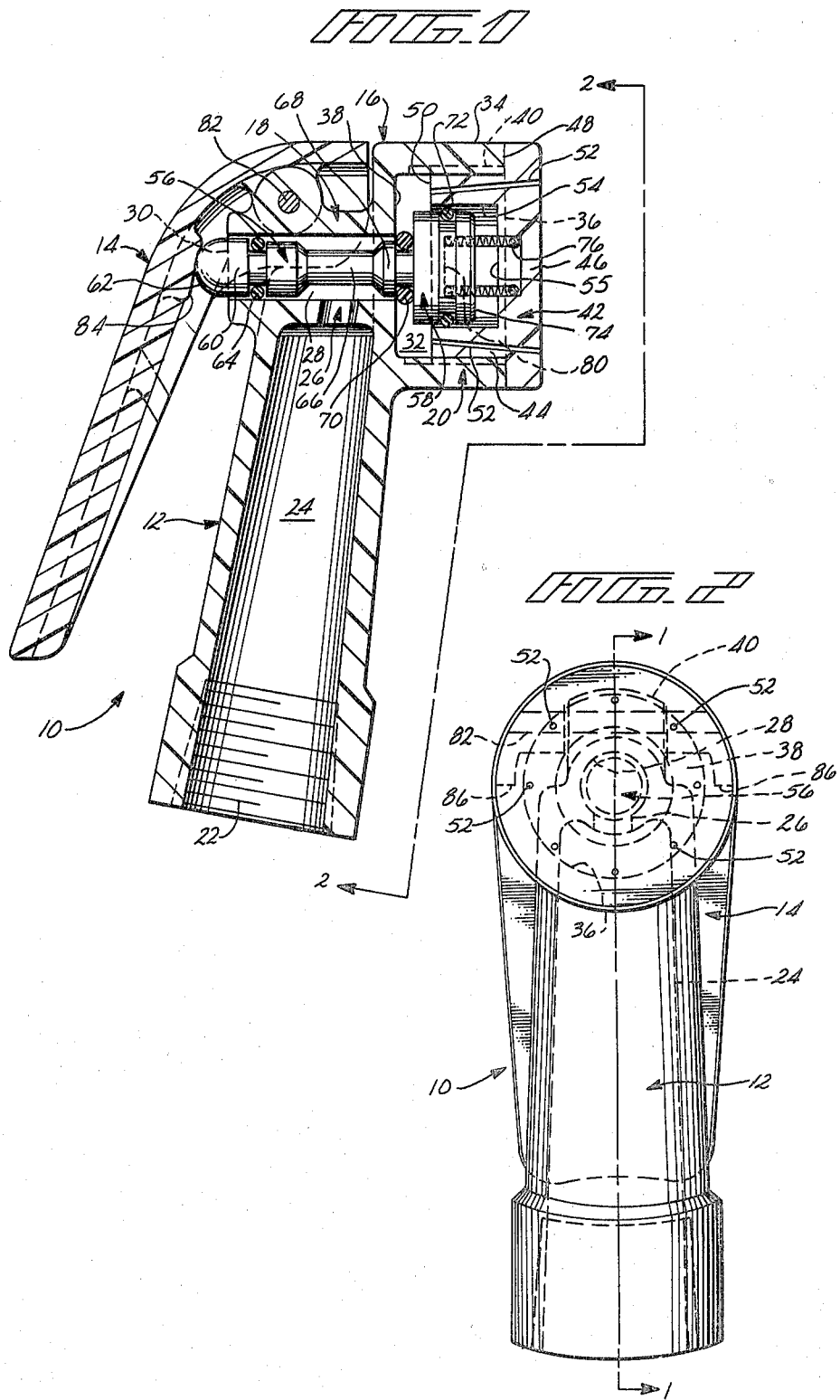

SPRAY GUN FOR CLEANING AND REMOVING STANDING PARTICLES FROM WAFERS AND SUBSTRATES

FIELD OF THE INVENTION

This invention relates to a hand-held spray gun for dispensing fluids such as liquids and gases. The invention is particularly useful in the art of rinsing and drying semiconductor wafers or substrates.

BACKGROUND OF THE INVENTION

In the manufacture of semiconductor products, the wafers or substrates from which the semiconductors are made are subjected to coating, etching and cleaning steps. It is critical that the wafers and substrates be maintained in an extremely clean condition. To this end, the wafers or substrates are commonly washed with deionized water and then dried with an inert gas such as nitrogen.

The wafers and substrates are commonly cleaned in a machine called a rinser-dryer, in which the wafers or substrates are first placed in a bowl and subjected to intense washing or rinsing with deionized water. The bowl is then rotated at high speeds, in the range of 1000 to 1200 r.p.m., during the drying cycle. Nitrogen gas dries the wafers or substrates during the drying step and removes any contaminating chemicals. Typical machines for rinsing and drying such wafers or substrates are disclosed in U.S. Pat. Nos. 3,727,620 to Orr, 3,990,462 to Elftmann et al, and 4,132,567 to Blackwood.

After the wafers and substrates have been thoroughly rinsed and dried, they can carry a large static charge, owing primarily to the high speed at which the wafers or substrates are rotated in the dry nitrogen atmosphere. Static charges on the surfaces of the wafers in the chamber at the end of the rinsing and drying cycle can be as high as 30,000 volts. This charge can draw dust and other contaminants to the surface of the wafers or substrates.

This invention provides a hand-held spray gun that can be used for spraying deionized water onto wafers or substrates during a rinsing step. Use of the spray gun for rinsing can avoid the high-speed rotation of the rinser-dryer, thereby minimizing the static electric charge problem.

On the other hand, if a rinser-dryer is used, the spray gun then can be used for neutralizing static charges by spraying an inert gas such as ionized nitrogen on the wafers during a drying process.

The spray gun is designed so that the fluid being sprayed, whether liquid or gas, is not contaminated with foreign materials, nor does it change the electrical charge of the media. In addition, the sprayer can be made from only a few injection molded parts, so that the spray gun is inexpensive and easy to operate.

SUMMARY OF THE INVENTION

Briefly, the spray gun has a supply chamber for receiving a fluid to be dispensed. A poppet valve is slidable in the supply chamber. The poppet valve has spaced-apart seals for normally sealing the ends of the supply chamber. One sealed end of the poppet valve seals the supply chamber from an adjacent fluid discharge chamber that communicates with one or more discharge passages extending to the exterior of the spray gun. The poppet valve controls movement of a valve guide element that slides in an internal valve guide cavity. A return spring in the cavity is biased against the valve guide. The return spring is isolated from fluid in the discharge chamber by an isolation seal between the valve guide and the wall of the cavity. When the poppet valve slides in the supply chamber, in response to an actuating force, it forces fluid in the chamber to apply pressure to fluid in the discharge chamber to dispense the fluid through the narrow passages leading to the exterior of the spray gun. The travel of the poppet valve causes the valve guide to slide in the cavity against the bias of the return spring. When the actuating force is released, the return spring automatically forces the valve guide and poppet valve to slide back to their normal position. Since the return spring is isolated from contact with fluid in the discharge chamber, contamination from any chemical reactions between the fluid and the return spring can be prevented. All other components of the spray gun are made from nonchemically reactive materials such as plastic.

These and other aspects of the invention will be more fully understood by referring to the following detailed description and the accompanying drawing.

DRAWING

FIG. 1 is a cross-sectional view, taken on line 1—1 of FIG. 2, showing a spray gun according to principles of this invention; and FIG. 2 is an end elevation view taken on line 2—2 of FIG. 1.

DETAILED DESCRIPTION

A spray gun 10 includes a pistol grip handle 12 and a trigger 14 adapted to be squeezed toward the handle for discharging a fluid contained in the body of the spray gun. The handle 12 is part of a spray gun body 16 which also includes a valve housing 18 and a nozzle-retaining portion 20.

The handle has an internally threaded opening 22 adapted for attachment to a source of fluid being dispensed. The handle is an elongated tubular body with a long, narrow internal passage 24 extending the length of the handle. A narrow inlet opening 26 at the end of the passage opens into a fluid supply chamber 28 extending generally axially through the valve housing portion of the spray gun body. The supply chamber 28 is a long cylindrical passage of uniform diameter and the small inlet opening 26 opens through a bottom side wall of the supply chamber. One end 30 of the supply chamber opens through an exterior side wall of the valve housing 18 adjacent the trigger 14.

The opposite end of the supply chamber, also referred to as an outlet, opens into one end of an enlarged interior recess 32 formed in the nozzle-retaining portion 20 of the spray gun body. The interior recess 32 also is referred to as a fluid discharge chamber. The supply chamber 28 is aligned axially with the central axis through the large interior recess 32. The recess 32 is cylindrical in shape and of uniform diameter. The nozzle-retaining portion 20 of the spray gun body is formed by a cylindrical wall 34 having an outer opening 36 and an internal annular face 38 through which the supply chamber 28 opens. The interior recess 32 has internal screw threads 40 extending for most of its length. The supply chamber 28 opens through the center of the annular face 38 inside the recess 32.

A nozzle 42 screws into the open end 36 of the recess. The nozzle includes an externally threaded interior portion 44 that screws into the threads 40 inside the recess 32. An exterior flange 46 at the end of the nozzle abuts against an annular outer face 48 of the nozzle-retaining portion 20 when the threaded portion of the nozzle is tightened into the recess 32. This leaves an internal annular face 50 of the nozzle inside the recess spaced a short distance from the annular face 38 at the end of the recess. Long, narrow fluid flow passages 52 extend from the annular face 50 of the nozzle to the exterior of the nozzle. In the illustrated embodiment, there are eight such passages uniformly spaced apart circumferentially around the nozzle.

A cylindrical valve guide cavity 54 is formed centrally in the interior portion 44 of the nozzle. The cavity opens through the annular interior face 50 of the nozzle, so that the cavity faces toward the annular face 38 of the discharge chamber 32 and toward the end of the supply chamber 28. The cavity extends along the central axis of the nozzle so that the axis of the cavity is aligned with the axis of the supply chamber. A circular end wall 55 is formed internally in the nozzle at the base of the cavity.

A poppet valve 56 is slidable axially in the supply chamber 28, and a cylindrical valve guide member 58 is slidable axially in the valve guide cavity 54 in the nozzle. The poppet valve and the guide member are formed integrally as a one-piece unit so they slide back and forth together during operation of the spray gun. One end of the poppet valve 56 has an elongated cylindrical valve element 60 which closely matches the inside diameter of the supply chamber. The valve element has a rounded exterior end portion 62 that normally protrudes outside the open end 30 of the supply chamber 28. An O-ring seal 64 carried by the valve element 60 seals against the inside wall of the supply chamber to seal fluid in the supply chamber from the exterior of the spray gun.

A central relief portion 66 of the poppet valve is normally aligned with the inlet opening 26 that opens into the bottom of the supply chamber. The relief portion of the poppet valve cooperates with the inside wall of the supply chamber to form an annular space inside the chamber that receives and holds a supply of fluid entering the chamber through the inlet opening 26.

The poppet valve is enlarged in diameter adjacent the relief portion to form a seal section 68 that closely matches the inside diameter of the supply chamber. The seal section of the poppet valve is normally positioned at the end of the supply chamber inboard the point where it opens into the fluid discharge chamber 32. The seal section 68 of the one-piece valve element is reduced in diameter to provide an annular slot for seating an O-ring seal 70 that normally seals the opening between the fluid supply chamber 28 and the fluid discharge chamber 32. The O-ring seal 70, also referred to as an outlet seal, is normally spring biased into contact with the face 38 of the fluid discharge chamber surrounding the outlet opening frm the supply chamber.

The one-piece valve element is enlarged in diameter adjacent the outlet seal 70 to form the valve guide member 58 which closely matches the interior diameter of the recess 54. An O-ring seal 72, also referred to as an isolation seal, is seated in an annular recess formed around the valve guide element. This O-ring seals against the wall of the valve guide cavity 54. The end of the valve guide element has a flat face 74 which is normally spaced inwardly from the interior end wall 55 of the cavity 54.

A coil spring 76 applies spring force to normally maintain the one-piece valve element in the position shown in FIG. 1. One end of the spring is seated in a recessed spring seat 68 formed centrally in the end wall 55 at the base of the cavity 54. The opposite end of the spring is seated in the recessed spring seat 80 formed centrally in the valve guide member 58. The axis of the spring is aligned with the axis of the fluid discharge chamber 32 and the axis of the supply chamber 28.

The trigger 14 of the spray gun is adapted to pivot toward and away from the spray gun body. A pivot pin 82 pivots the trigger to the valve housing 18 of the spray gun body. The underside of the trigger 14 has a bearing surface 84 which normally engages the rounded end portion 62 of the poppet valve which projects outwardly from the spray gun body. The normal bias of the return spring 76 urges the poppet valve into the position shown in FIG. 1. In this position, the end portion of the poppet valve protrudes and bears against the bearing surface 84 on the underside of the trigger. Flanged sides 86 of the trigger fit into cooperating recessed regions of the spray gun body. When the spray gun trigger is biased into its normal position shown in FIG. 1, the front side of the trigger acts as a stop against further rotation of the trigger to hold the trigger in a fixed position.

Thus, the bias of the return spring 76 serves a number of purposes. It urges the one-piece valve element toward the left of FIG. 1. This bias holds the trigger of the spray gun in the normal position shown in FIG. 1, while simultaneously forcing the outlet seal 70 against the annular face 38 of the fluid discharge chamber 32 to close the outlet from the supply chamber 28. While in this position, the supply chamber is sealed at opposite ends by the O-rings 70 and 64 while being open to the passage of fluid through the inlet opening 26. The isolation seal 72 also seals against the wall of the valve guide cavity 54 to isolate the return spring from fluid in the fluid discharge chamber 32.

In using the spray gun, the pistol grip handle 12 is held by hand and the trigger is squeezed against the pistol grip to actuate the one-piece valve element. This causes the poppet valve 56 to slide axially in the supply chamber 28 (to the right in FIG. 1), which also causes the outlet seal 70 to move to the right in FIG. 1, and unseal the outlet opening of the supply chamber. The axial travel of the poppet valve forces fluid in the supply chamber to move into the fluid discharge chamber 32, causing fluid in that chamber to be forced outwardly through the fluid discharge passages 52. As the valve element slides axially, the trigger bottoms out, which serves as a stop against further travel of the valve element. When the force against the spray gun trigger is released, the return spring 76 applies an axial force in the opposite direction to return the valve element to its normal position shown in FIG. 1. The outlet seal 70 slides back into contact with the annular face 38 of the fluid discharge cavity 32 to serve as a stop for the valve element while also closing the outlet from the fluid supply chamber.

The spray gun is made from only five separate parts (the spray gun body, the nozzle, the trigger, the valve and the return spring). Except for the spring, all parts are injection molded from plastic so that all elements of the spray gun that come into contact with the fluid are made of non-metallic, non-chemically reactive materials, i.e., non-reactive with respect to the intended media with which the spray gun is used. The return spring is made of a plastic-coated metal, but the return spring is isolated from contact with the fluid dispensed by the spray gun. Thus, there is no contamination of the fluid due to possible chemical reactions between the fluid and the components of the spray gun. In addition to using the spray gun for dispensing deionized water for washing wafers or substrates, the spray gun also can be used to dispense other chemicals such as acids and solvents to blow air or other inert gas, i.e., nitrogen, and to neutralize and remove contaminants which may cling to the surfaces of wafers or substrates by static attraction. Preferably, the plastic elements of the spray gun are made from Teflon PFA, a fluorocarbon resin manufactured by DuPont.

We claim:

1. A hand-held and hand-actuated spray gun, comprising:
   a valve housing;
   a fluid supply chamber in the valve housing, the fluid supply chamber having an oulet and an inlet from a source of fluid;
   a fluid discharge chamber in the valve housing, the outlet from the fluid supply chamber communicating with the fluid discharge chamber;
   a nozzle in the valve housing, the nozzle having one or more fluid discharge passages extending from the fluid discharge chamber to the exterior of the spray gun;
   an internal valve guide cavity adjacent the fluid discharge passage;
   a poppet valve in the fluid supply chamber;
   a chamber outlet seal on the poppet valve for normally sealing the outlet of the fluid supply chamber against flow of fluid into the fluid discharge chamber;
   a valve guide on the poppet valve;
   an isolation seal on the valve guide forming a seal against the wall of the valve guide cavity;
   a return spring in the valve guide cavity biased against a side of the valve guide opposite the fluid discharge chamber, the isolation seal providing a means for isolating the return spring from contact with fluid in the fluid discharge chamber; and
   means for sliding the poppet valve in the fluid supply chamber for unsealing the chamber outlet seal and forcing fluid in the fluid supply chamber to flow into the fluid discharge chamber and then through the fluid discharge passages, the valve guide being movable with the poppet valve against the bias of the return spring during ejection of fluid through the fluid discharge passages, the bias of the return spring against the valve guide normally sliding the poppet valve in the opposite direction when the actuating force is released to bias the chamber outlet seal into its sealed position sealing the outlet of the fluid supply chamber.

2. Apparatus according to claim 1 in which the poppet valve and valve guide are a one-piece unit.

3. Apparatus according to claim 2 in which the nozzle is a separate piece that fits into the spray gun housing after the one-piece valve element is assembled into the housing.

4. Apparatus according to claim 3 in which the valve housing, the one-piece valve element, and the nozzle are each made of chemically inert materials.

5. Apparatus according to claim 1 in which the valve actuating means comprises a trigger; and including means for pivoting the trigger to the valve housing, the poppet valve having a portion which extends outside the spray gun housing into contact with a portion of the housing slides the poppet valve in the fluid supply chamber.

6. Apparatus according to claim 5 in which the poppet valve carries a seal that seals against the wall of the fluid supply chamber adjacent the projecting portion of the poppet valve.

* * * * *